(12) United States Patent
Furuhata

(10) Patent No.: US 6,249,021 B1
(45) Date of Patent: Jun. 19, 2001

(54) NONVOLATILE SEMICONDUCTOR MEMORY DEVICE AND METHOD OF MANUFACTURING THE SAME

(75) Inventor: Tomoyuki Furuhata, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/308,993

(22) PCT Filed: Oct. 5, 1998

(86) PCT No.: PCT/JP98/04486

§ 371 Date: Aug. 24, 1999

§ 102(e) Date: Aug. 24, 1999

(87) PCT Pub. No.: WO99/18616

PCT Pub. Date: Apr. 15, 1999

(30) Foreign Application Priority Data

Oct. 6, 1997 (JP) ...................................................... 9-273136

(51) Int. Cl.[7] ...................................................... H01L 29/72
(52) U.S. Cl. ........................ 257/316; 257/321; 257/410; 257/412
(58) Field of Search ................................. 257/316, 321, 257/410, 412

(56) References Cited

FOREIGN PATENT DOCUMENTS

| 9-8154 | 1/1997 | (JP) . | |
|---|---|---|---|
| 9-8157 | 1/1997 | (JP) . | |
| 8154 | * 1/1997 | (JP) | ...................................... 257/314 |

* cited by examiner

*Primary Examiner*—Edward Wojciechowicz
(74) *Attorney, Agent, or Firm*—Oliff & Berridge, PLC

(57) ABSTRACT

A nonvolatile semiconductor memory device comprising: a semiconductor substrate (20); and a memory transistor (100) including a source region (20S) and a drain region (20D) which are impurity diffusion layers formed in the semiconductor substrate, a tunnel insulating layer (25) formed on the semiconductor substrate, and a staked-structure gate electrode (20G) having a floating gate (24), a dielectric layer (23) and a control gate (22) which are layered on the tunnel insulating layer. The floating gate (24) is formed of a polysilicon layer having an impurity concentration of $1 \times 10^{19}$ to $1 \times 10^{20}$ cm$^{-3}$. Denoting the impurity concentration of a polysilicon layer constituting the floating gate (24) as $C_{FG}$ and the impurity concentration of a polysilicon layer constituting the control gate (22) as $C_{CG}$, it is preferable that the following relational expression (1) be satisfied:

$$0.3 \times C_{FG} \leq C_{CG} \leq 0.8 \times C_{FG}$$

In the nonvolatile semiconductor memory device in the present invention, an impurity concentration of the polysilicon layer constituting the floating gate is in a specific range for preventing deterioration of the film quality of the tunnel insulating layer due to impurities contained in the floating gate, thereby making it possible to enhance characteristics such as an erase characteristic and a data retaining characteristic.

13 Claims, 8 Drawing Sheets

NONVOLATILE SEMICONDUCTOR MEMORY DEVICE AND METHOD OF MANUFACTURING THE SAME

TECHNICAL FIELD

The present invention relates to a nonvolatile semiconductor memory device and a method of manufacturing the same. More particularly, the present invention pertains to a nonvolatile semiconductor memory device featuring performance of flash erasure of memory transistors and reduced variation in erase operation time, and a manufacturing method thereof.

BACKGROUND OF ART

A flash-type EEPROM contains a multiplicity of memory transistors. FIG. 16 shows a schematic sectional view of one of these memory transistors. A memory transistor 200 comprises a source region 55 and a drain region 56, which are impurity diffusion layers formed in a semiconductor substrate 50, and a tunnel oxide film 51, a floating gate 52, a dielectric layer 53, and a control gate 54 which are layered on the semiconductor substrate 50. On the side areas of the layered floating gate 52, dielectric layer 53 and control gate 54, there is provided a side wall 57 made of an insulating material.

In the memory transistor 200, information is programmed by injecting electrons 58 into the floating gate 52 (which is a write operation, indicated by an arrow 59 in FIG. 16) and by drawing the electrons from the floating gate 52 (which is an erase operation, indicated by an arrow 59' in FIG. 16).

In the flash-type EEPROM, an erase operation is performed on a plurality of memory transistors entirely. In most cases, erasure is carried out on the entire EEPROM or on each page corresponding to a group of plural memory transistors. For example, an erase operation is accomplished as described below.

A source voltage Vs, which is a high potential (e.g., 12 V), is applied to the source region 55. At this step, the control gate 54 and the semiconductor substrate 50 have a ground potential, and the drain region 56 is open. In this state, electrons 58 stored in the floating gate 52 are drawn into the source region 55 through the thin tunnel oxide film 51 by means of the Fowler-Nordheim tunnel, as indicated by the arrow 59' in FIG. 16. This results in a threshold voltage Vg of the memory transistor 200 being equal to a threshold voltage level of a common MOS transistor.

In the flash-type EEPROM used as a storage device, it is desirable that the erase operation mentioned above should be carried out at higher speed. Namely, a period of time required for a flash erase operation (i.e., an erase characteristic) is of critical importance in the flash-type EEPROM.

Further, the erase characteristic is required to be uniform among respective memory elements. If the erase characteristic is not uniform among the memory elements, a malfunction may occur in the memory element to cause various problems as mentioned below.

For instance, when the time required for erasure in some memory transistors is longer than a predetermined erase operation time, electrons remain stored in the floating gates of these memory transistors. This condition is called "under-erasure". On the contrary, when the time required for erasure in some memory transistors is shorter than a predetermined erase operation time, electrons are drawn excessively from the floating gates of these memory transistors. This condition is called "over-erasure".

In the case where the degree of variation in the erase characteristic is small among the memory transistors, it is possible to select an erase operation time "T" that allows proper erasure of any memory transistors. However, in case that the degree of variation in the erase characteristic is large, there is a substantial possibility that under-erasure or over-erasure may occur at some cells. Further, in the case where the degree of variation in the erase characteristic is extremely large, under-erasure or over-erasure will occur inevitably in some memory transistors, no matter what erase operation time "T" maybe selected. Thus, it becomes impossible to perform proper erasure in any memory transistors.

For realizing a high-speed flash-type EEPROM, it is required to decrease the erase operation time "T" insofar as possible. Since erasure is performed by drawing electrons from the floating gate 52 to the source region 55 as described above, a higher-speed erase operation may be achieved by increasing an overlapping area of the floating gate 52 and the source region 55. When the overlapping area is too large, however, a problem such as a malfunction may be prone to occur.

Therefore, for a realization of the high-speed flash-type EEPROM, it is required to increase the overlapping area of the source region and floating gate to the extent that no malfunction will occur, while minimizing the degree of variation in the overlapping area among respective memory transistors.

DISCLOSURE OF THE INVENTION

It is an object of the present invention to provide a nonvolatile semiconductor memory device comprising a memory transistor having a uniform erase characteristic to enable high-speed flash erasure, and a method of manufacturing the same.

As one aspect of the present invention, there is provided a nonvolatile semiconductor memory device, comprising:

a semiconductor substrate; and a memory transistor including a source region and a drain region which are impurity diffusion layers formed in the semiconductor substrate, a tunnel insulating layer formed on the semiconductor substrate, and a gate electrode of a stacked structure having a floating gate, a dielectric layer and a control gate which are layered on the tunnel insulating layer, wherein the floating gate is formed of a polysilicon layer having an impurity concentration of $1 \times 10^{19}$ to $1 \times 10^{20}$ cm$^{-3}$.

In the nonvolatile semiconductor memory device mentioned above, since an impurity concentration of the polysilicon layer constituting the floating gate is in a specified range, deterioration of the film quality of the tunnel insulating layer due to impurities contained in the floating gate can be prevented, and it is possible to improve an erase characteristic and a data retaining characteristic. Further, the impurity concentration of the polysilicon layer constituting the floating gate is preferably in a range of $1 \times 10^{19}$ to $5 \times 10^{19}$ cm$^{-3}$.

Denoting the impurity concentration of a first polysilicon layer constituting the floating gate as $C_{FG}$ and the impurity concentration of a second polysilicon layer constituting the control gate as $C_{CG}$, it is preferable that the following relational expression be satisfied:

$$0.3 \times C_{FG} \leq C_{CG} \leq 0.8 \times C_{FG}$$

By setting up the above relationship, the impurity concentrations of the polysilicon layers constituting to the floating gate and the control gate approximate each other. Consequently, in forming an electrode comprising the floating gate, dielectric layer, and control gate by means of etching, the end portion of each layer can be aligned in the thickness direction to allow formation of an ideal stacked-structure gate electrode. According to the inventors of the present invention, it has been confirmed that such an ideal stacked gate structure greatly contributes to an improvement in the data retaining characteristic, for example.

In the source region, an overlapping region with the floating gate is preferably 25 to 45% of a bottom surface of the floating gate. A high-speed erasure can be possible by such an arrangement that the source region and the floating gate are formed to sufficiently overlap each other to the proper extent that a malfunction can be prevented.

Further, the source region preferably comprises a first diffusion region having a high impurity concentration, and a second diffusion region disposed outside the first diffusion region and having an impurity concentration lower than that of the first diffusion region. In such an arrangement that the source region is formed in a double diffusion structure, it becomes possible to control the transfer rate of electrons to move from the floating gate to the source region.

As another aspect of the present invention, there is provided a method of manufacturing a nonvolatile semiconductor memory device, comprising steps of:

(a) forming a tunnel insulating layer, a first polysilicon layer for a floating gate, a dielectric layer, and a second polysilicon layer for a control gate in a memory transistor formation region on a semiconductor substrate;

(b) forming a gate electrode of a stacked structure including a floating gate, a dielectric layer, and a control gate by patterning the second polysilicon layer, the dielectric layer, and the first polysilicon layer; and (c) forming a source region and a drain region in the semiconductor substrate by doping with an impurity;

wherein, in the step (a), the first polysilicon layer is doped with an impurity at a concentration of $1 \times 10^{19}$ to $1 \times 10^{20}$ cm$^{-3}$.

Further, a concentration of the impurity is preferably in a range of $1 \times 10^{19}$ to $5 \times 10^{19}$ cm$^{-3}$.

A dose for attaining such an impurity concentration as indicated above depends on the film thickness of the polysilicon layer, and therefore cannot be defined conclusively. For example, where the first polysilicon layer has a film thickness of 80 to 200 nm, it is formed by doping a polysilicon layer with a dose of an impurity ion preferably in a range of $1 \times 10^{14}$ to $1 \times 10^{15}$ cm$^{-2}$, or more preferably in a range of $1 \times 10^{14}$ to $5 \times 10^{15}$ cm$^{-2}$.

In the semiconductor device manufacturing method of the present invention, it is further preferable to comprise a step (d), before the step (c), for forming a protective oxide layer to cover exposed surface of at least the tunnel insulating layer and gate electrode.

Since an impurity concentration of the first polysilicon layer is set at the range indicated above in the step (a), the film thickness of the protective oxide film formed at least on an exposed surface (side wall) of the floating gate can be decreased at the step (d). This makes it possible to provide advantageous effects as mentioned below.

In general, a protective oxide film formed on an exposed surface of the floating gate by means of thermal oxidation, for example, has a thickness of 15 to 20 nm. The overlap area of the floating gate and the source region is reduced by this thickness of the protective oxide film. However, by making the impurity concentration of the first polysilicon layer lower than that in common practice at the step a), the thickness of the protective oxide film formed on the exposed surface of the floating gate can be made to a range of 5 to 15 nm or more preferably to a range of 8 to 12 nm. Thus, the overlapping area of the floating gate and the source region (effective area of the tunnel insulating layer) may be enlarged uniformly, making it possible to improve the erase characteristic.

Representative examples of nonvolatile semiconductor memory devices of the present invention include an erasable programmable read-only memory (EPROM), electrically erasable programmable read-only memory (EEPROM), flash EEPROM, embedded memory containing any of these nonvolatile memories, programmable logic device (PLD), and the like.

BEST MODE FOR CARRYING OUT THE INVENTION

Semiconductor Device

Figure 1:
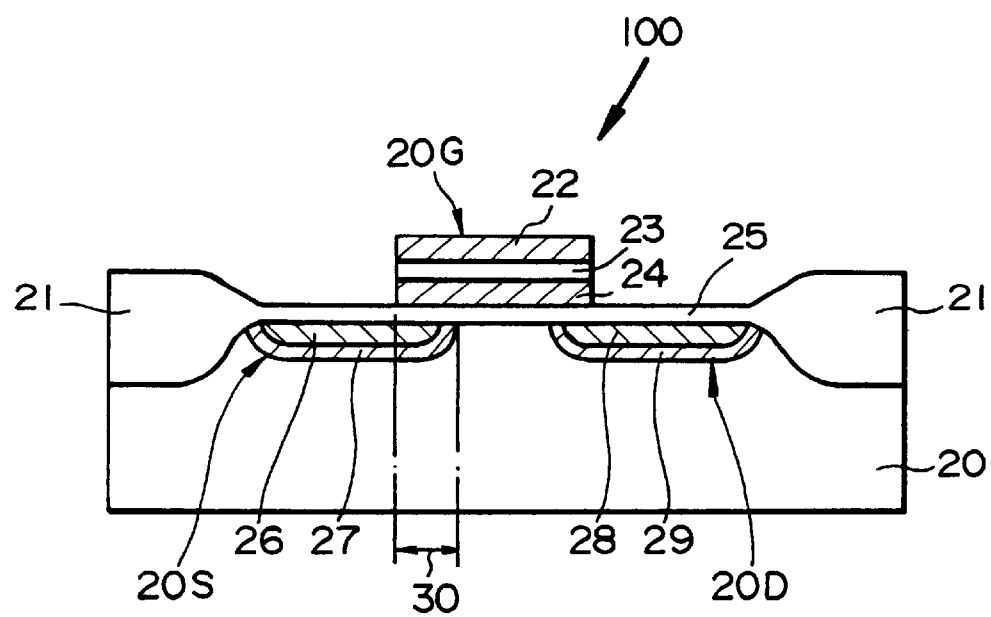
FIG. 1 is a schematic sectional view of an example of a memory transistor in a flash-type EEPROM to which a nonvolatile semiconductor memory device of the present invention is applies.

FIG. 1 shows a schematic sectional view of an example of a memory transistor in a flash-type EEPROM to which a nonvolatile semiconductor memory device of the present invention is applied.

A memory transistor 100 comprises a field oxide region 21 and a tunnel oxide film (tunnel insulating layer) 25 formed on a P-type semiconductor substrate 20. On the tunnel oxide film 25, there are layered a floating gate 24, a three-layer-structure ONO film (dielectric layer) 23 formed of a silicon oxide film, a silicon nitride film and a silicon oxide film, and a control gate 22 to provide a gate electrode 20G of a stacked structure.

In the semiconductor substrate 20, a source region 20S and a drain region 20D are formed at both sides of the gate electrode 20G. The source region 20S comprises a first $N^+$ type diffusion region 26 having a high impurity concentration and a second $N^-$ type diffusion region 27 disposed outside the first diffusion region and having an impurity concentration lower than that of the first diffusion region 26. The drain region 20D comprises a first $N^+$ type diffusion region 28 having a high impurity concentration and a second $N^-$ type diffusion region 29 which is disposed outside the first diffusion region 28 and having an impurity concentration lower than that of the first diffusion region 29. In this arrangement where the source region 20S is formed in a double diffusion structure, it is possible to adjust the transfer rate of electrons in movement from the floating gate 24 to the source region 20S.

The floating gate 24 is formed of a polysilicon layer having an impurity concentration of $1 \times 10^{19}$ to $1 \times 10^{20}$ cm$^{-3}$, preferably of $1 \times 10^{19}$ to $5 \times 10^{19}$ cm$^{-3}$. Since the impurity concentration of the polysilicon layer constituting the floating gate 24 is in the specific range indicated above, deterioration of the film quality of the tunnel insulating layer due to impurities contained in the floating gate 24 can be prevented, and characteristics such as an erase characteristic, a gate disturbance characteristic, and a data retaining characteristic can be improved. Data for these characteristics will be described later.

Further, by setting the impurity concentration of the polysilicon layer constituting the floating gate 24 in the specific range indicated above, the thickness of a protective oxide film formed on an exposed surface (side wall) of the floating gate can be thinner as described later. As a result, the overlapping area of the floating gate 24 and the source region 20S can be wider by a decreased thickness of the protective oxide film, and making it possible to increase the effective area of the tunnel insulating layer. Still further, by setting the impurity concentration of the polysilicon layer constituting the floating gate 24 in the specific range indicated above, it is possible to decrease the degree of variation in the thickness of the protective oxide film formed on the exposed surface (side wall) of the floating gate. This reduces the degree of variation in the overlapping area of the floating gate 24 and the source region 20S, thereby making it possible to provide a uniform erase characteristic.

Denoting the impurity concentration of a first polysilicon layer constituting the floating gate 24 as $C_{FG}$ and the impurity concentration of a second polysilicon layer constituting the control gate 22 as $C_{CG}$, it is preferable that the following relational expression (1) be satisfied:

$$0.3 \times C_{FG} \leq C_{CG} \leq 0.8 \times C_{FG} \quad (1)$$

Under this relational condition, the impurity concentration of the polysilicon layer constituting the floating gate 24 is lower than or approximately equal to that of the polysilicon layer constituting the control gate 22. Thus, in etching the floating gate, ONO film, and control gate layers, the end portion of these layers can be aligned in the thickness direction so that an ideal stacked structure for the gate electrode 20G can be obtained.

The control gate 22 is preferably formed in a known polycide structure having a metallic silicide layer on a doped polysilicon layer for enhancing conductivity.

In the source region 20S, a region 30 overlapping the floating gate 24 is preferably 25 to 45% of the bottom surface of the floating gate 24. By overlapping the source region 20S and the floating gate 24 one another to a broad extent, electrons can be quickly drawn from the floating gate 24 to the source region 20S, thereby enabling a high-speed erase operation.

Semiconductor Device Manufacturing Method

Referring to FIGS. 2 to 7, schematic sectional views are shown for explaining the manufacturing steps of the memory transistor 100 indicated in FIG. 1.

Figure 2:
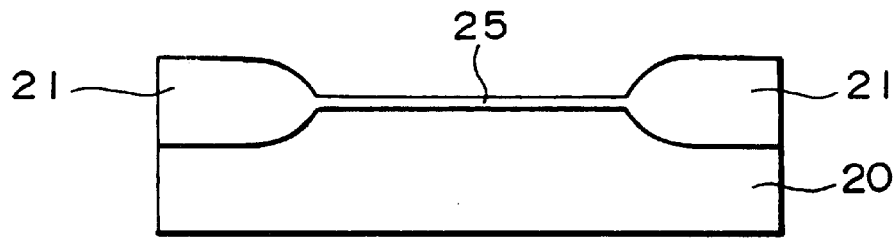
FIG. 2. is a schematic sectional view illustrating a manufacturing step of the memory transistor indicated in FIG. 1.

(A) As shown in FIG. 2, a field oxide film 21 is formed on a semiconductor substrate 20, and then a tunnel oxide film 25 is formed on the semiconductor substrate 20. For formation of the field oxide film 21, a known technique is applicable. For formation of the tunnel oxide film 25, oxidation is carried out in a dry oxygen atmosphere at an oxidizing temperature of approx. 750 to 1000° C. or in a wet oxygen atmosphere at an oxidizing temperature of approx. 750 to 850° C. The tunnel oxide film 25 thus formed is approx. 6 to 12 nm thick.

Figure 3:
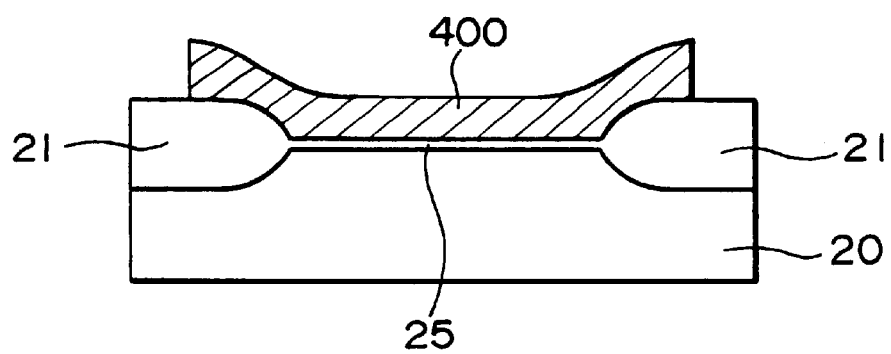
FIG. 3 is a schematic sectional view illustration manufacturing step of the memory transistor indicted i FIG. 1.

(B) Then, as shown in FIG. 3, a first polysilicon layer 400 to be a floating gate is deposited. Deposition of the first polysilicon layer 400 can be performed by a chemical vapor deposition (CVD) method, for example, using monosilane (SiH$_4$) as a material gas under a temperature of 550 to 620° C. The first polysilicon layer 400 is preferably 80 to 200 nm thick, or more preferably 100 to 130 nm thick.

Further, to provide conductivity to the first polysilicon layer 400, arsenic or its compound is ion implanted into the first polysilicon layer 400. This ion implantation is carried out under conditions that the implanting voltage is 20 to 30 keV and the dose is $1 \times 10^{14}$ cm$^{-2}$ to $1 \times 10^{15}$ cm$^{-2}$. Besides arsenic, any other substance capable of providing N-type conductivity such as phosphorus may be used as an impurity for ion implantation.

In the present embodiment, ion implantation is performed with the polysilicon layer 400 directly exposed. Instead of this method, a so-called "through implant" technique may be adopted. In this technique, for preventing the polysilicon layer from being damaged by ion implantation, a thin oxide film or the like is formed on the polysilicon layer. Using the thin oxide film as a transmission film, the kinetic energy of ions to be implanted is controlled so that the ions will be implanted into a desired layer only.

In this process step, the use of ion implantation method is advantageous in that the concentration of doped impurity can be made lower than with other technique. In case a protective oxide film is formed by means of thermal oxidation at a step to be taken before the subsequent step of forming source and drain regions, a protective oxide film on a side-wall of a gate electrode tends to be thicker than a protective oxide film on a principal surface due to the effect of impurity ions. Therefore, in the present invention, the impurity concentration of the first polysilicon layer 400 for the floating gate is reduced so that a side-wall protective oxide film formed on the floating gate by thermal oxidation will be as thin as possible.

In formation of the polysilicon layer 400, as an impurity doping method other than ion implantation, any of the following techniques may be employed; a method of introducing carrier gas containing phosphoryl chloride (POCl$_3$) after forming the polysilicon layer, a method of introducing carrier gas containing phosphine (PH$_3$) at the formation of the polysilicon layer, and the like.

Thereafter, anisotropic photoetching is carried out to etch the polysilicon layer 400. Thus, a part of the polysilicon layer 400 is left to form the floating gate.

Figure 4:
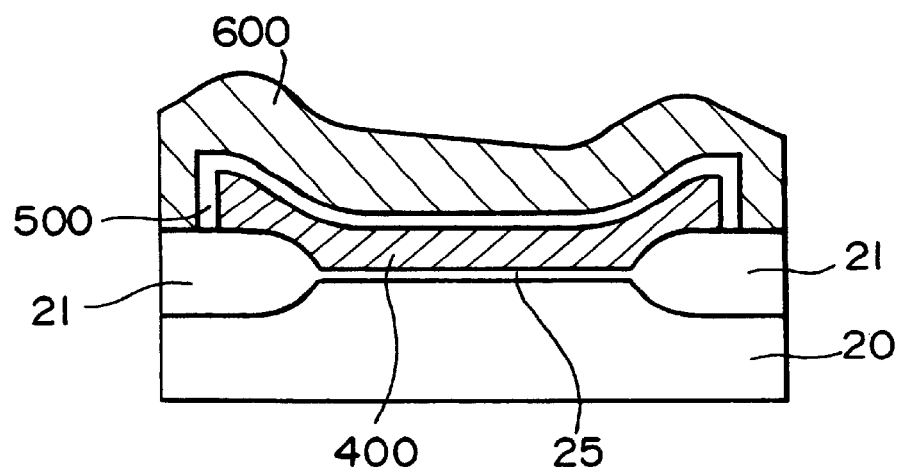
FIG. 4 is a schematic sectional view illustrating a manufacturing step of the memory transistor indicated in FIG. 1.

(C) Then, as shown in FIG. 4, an ONO film (oxide film—nitride film—oxide film) 500 used as a dielectric layer is formed. For example, a thermal oxidation method or a CVD method can be used for oxide film deposition, and a CVD method can be used for nitride film deposition. In the ONO film 500, the lowermost-layer oxide film is 6 to 20 nm thick, the nitride film is 8 to 20 nm thick, and the uppermost-layer oxide film is 2 to 6 nm thick. The total thickness of the ONO film 500 is preferably approx. 10 to 40 nm (in terms of oxide film thickness).

Subsequently, a second polysilicon layer 600 to be a control gate is deposited under the same conditions as for formation of the first polysilicon layer 400 to be the above-mentioned floating gate. As described in the foregoing, it is preferable that the second polysilicon layer 600 contains impurities at a concentration satisfying the relational expression (1) with respect to the first polysilicon layer 400.

Figure 5:
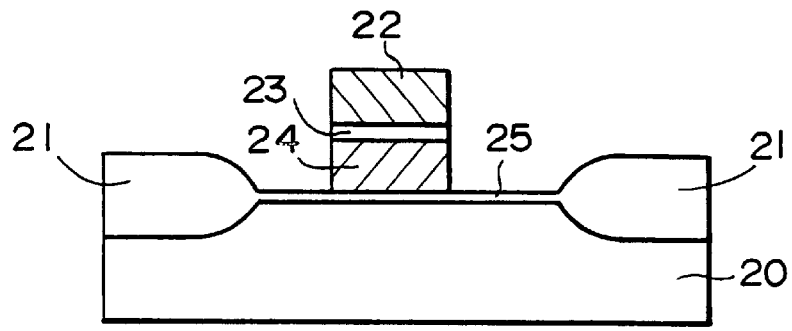
FIG. 5 is a schematic sectional view illustrating a manufacturing step of the memory transistor indicated in FIG. 1.

(D) Then, as shown in FIG. 5, a photoresist is applied on the second polysilicon layer 600, and the photoresist is patterned to form a resist layer (not shown). Then, using this resist layer as a mask, the second polysilicon layer 600 is etched to form the control gate 22. For this etching, it is preferable to use anisotropic dry etching.

Subsequently, using the control gate 22 as a mask, etching is carried out in a self-alignment manner to form an ONO film 23 and a floating gate 24. For this etching, it is also preferable to use anisotropic dry etching.

In this step, lateral dimensional processing accuracy, i.e., allowable error of gate length or width with respect to a specified design dimension is approx. ±0.03 to 0.05 μm.

Figure 6:
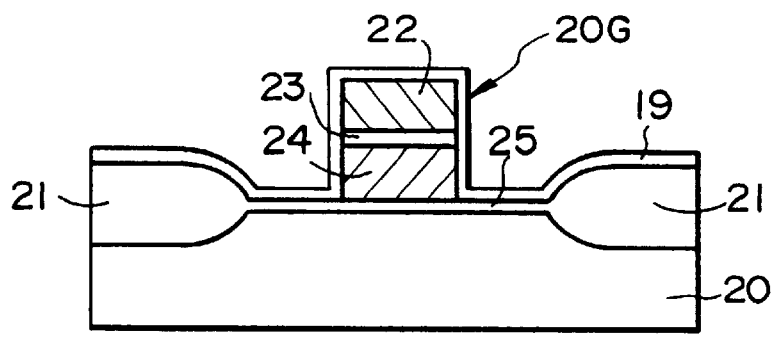
FIG. 6 is a schematic sectional view illustrating a manufacturing step of the memory transistor indicated in FIG. 1.
Figure 7:
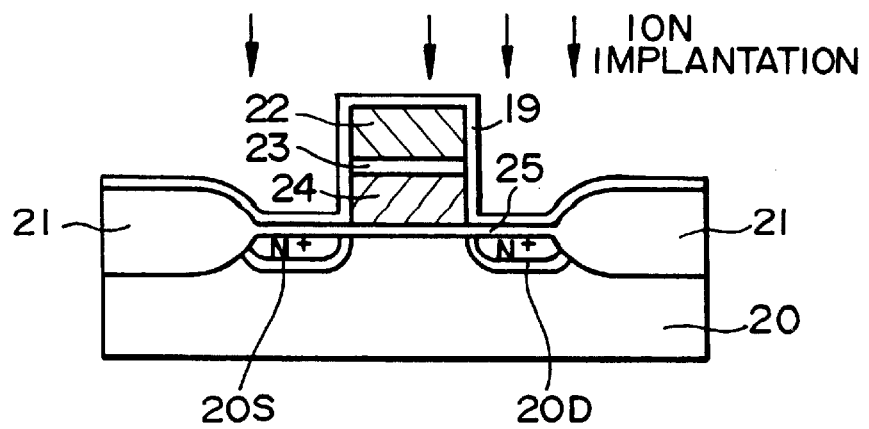
FIG. 7 is a schematic sectional view illustrating a manufacturing step of the memory transistor indicated in FIG. 1.

(E) Then, as shown in FIG. 6, a protective oxide film 19 is formed on the surface of the wafer, i.e., on the surface of the tunnel oxide film 25, gate electrode 20G, and field oxide film 21. The protective oxide film 19 serves to prevent possible damage to the principal surface of the semiconductor substrate 20 and the tunnel oxide film 25 during ion implantation at the subsequent step (F). It also serves to suppress an influence caused by energy spread during ion implantation. The protective oxide film 19 may be formed by a thermal oxidation method or CVD method, for example.

In case the thermal oxidation method is used, the oxidizing temperature is set at approx. 800 to 950° C. The thickness of the protective oxide film thus formed is approx. 5 to 15 nm. As aforementioned, in thermal oxidation, the protective oxide film on the side wall of the floating gate 24 tends to be thicker than the protective oxide film on the principal surface. However, the concentration of ions to be implanted in the floating gate 24 is adjusted so that the thickness of the protective oxide film on the side wall of the floating gate 24 can be made approximately equal to that of the protective oxide film on the principal surface. The protective oxide film on the side wall of the floating gate 24 is preferably 5 to 15 nm thick or more preferably 8 to 12 nm thick.

When the CVD method is used, the thickness of the protective oxide film on the side wall of the floating gate becomes approximately equal to that of the protective oxide film on the principal surface. Exemplified below are conditions for depositing an oxide film of a thickness of 5 to 15 nm using the CVD method:

Substrate temperature:
  350 to 450° C.

Monosilane (SiH$_4$) gas flow rate:
  60 to 90 sccm

Oxygen (O$_2$) gas flow rate:
  400 to 500 sccm

Exemplified below are conditions for depositing an oxide film of a thickness of 5 to 15 nm using the high-temperature oxide (HTO):

Substrate temperature:
  750 to 850° C.

Pressure:
  100 pascals

Monosilane (SiH$_4$) gas flow rate:
  30 to 50 sccm

Nitrogen monoxide (N$_2$O) gas flow rate:
  1500 to 2000 sccm (F) Then, using the gate electrode 20G as a mask, ion implantation is carried out to form a source region 20S and a drain region 20D, each having a double diffusion structure. Arsenic, phosphorus or any compound thereof may be used for ion implantation.

Double-diffusion-structure regions can be formed by a known technique such that plural species of ions are applied in implantation. For instance, in each of the source region 20S and the drain region 20D, a second diffusion region of an N$^-$ type can be formed by implanting ions of a second N type (phosphorus) at a dose of $2 \times 10^{14}$ to $8 \times 10^{14}$ cm$^{-2}$ and an accelerating voltage of 50 to 100 keV, and a first diffusion region of an N$^+$ type can be formed by implanting ions of a first N type (arsenic) at a dose of $2 \times 10^{15}$ to $6 \times 10^{15}$ cm$^{-2}$ and an accelerating voltage of 40 to 60 keV. By arranging the double diffusion structure in at least the source region, it becomes possible to control the transfer rate of electrons in drawing from the floating gate.

Then, to ensure an overlapping area of the source region 20S and the floating gate 24, drive-in diffusion is carried out to activate the implanted ions so that they will be diffused. The diffusion temperature is 900 to 950° C. In the source region 20S, the area overlapping the floating gate 24 is preferably 25 to 45% of the bottom area of the floating gate 24.

According to operating conditions required for a flash-type EEPROM to be manufactured, the overlapping area may be determined in the design phase thereof. Since the stacked-structure gate electrode 20G is used as a mask in ion implantation as mentioned above, the overlapping area can be controlled with extremely high accuracy. Further, since the thickness of the protective oxide film 19 formed on the side wall of the gate electrode 20G at the step (E) can be decreased in a certain range, it is possible to enlarge the overlapping area uniformly. This signifies that the degree of variation in the overlay area among respective memory transistors can be reduced, i.e., the erase characteristic there among can be made uniform. Still further, since the overlapping area can be made wider than in conventional devices, it is possible to decrease the time required for flash erasure.

In an experiment conducted by the inventors, it has been revealed that the flash erasure time in a flash-type EEPROM of the present invention is as short as approx. 50 ms while that in a flash-type EEPROM for a comparison is approx. 5 ms. In the flash-type EEPROM employed for the comparison, the thickness of the protective oxide film on the side wall is 18 to 25 nm and the overlapping area of the source region and the floating gate is 10 to 20% of the bottom of the floating gate.

In the subsequent process steps, common manufacturing methods of semiconductor device are applicable.

As mentioned hereinabove, in the present invention, the protective oxide film 19 on the side wall of the stacked-structure gate electrode 20G, more particularly on the side wall of the floating gate 24, can be made thinner by decreasing the concentration of impurities in the floating gate 24. In the case where the impurity concentration of the floating gate 24 is in the range of $1 \times 10^{19}$ to $1 \times 10^{20}$ cm$^{-3}$, the protective oxide film 19 on the side wall of the gate electrode 20G can be formed at a thickness of approx. 5 to 15 nm. Further, in the case that the impurity concentration of the floating gate 24 is in the range of $1 \times 10^{19}$ to $5 \times 10^{19}$ cm$^{-3}$, the protective oxide film 19 on the side wall of the gate electrode 20G can be formed at a thickness of 8 to 12 nm. By controlling the thickness of the protective oxide film 19 on the side wall of the gate electrode 20G, the overlapping area of the source region 20S and the floating gate 24 can be ensured to increase the effective area of the tunnel insulating layer.

Other Preferred Embodiment

After the step (E) in the embodiment mentioned above, there may be provided a step that the protective oxide film 19 formed in the step (E) is selectively removed at the portion on the side wall of the gate electrode 20G. For removal of the protective oxide film, an etch-off process may be performed using a buffer hydrofluoric acid solution (BHF) prepared by mixing 30% hydrofluoric acid solution (HF) and 30% ammonium fluoride solution (NH$_4$F) in a volume ratio of 1:50. Since isotropic etching is carried out with the buffer hydrofluoric acid solution, it is desirable to use a mask for removing only the protective oxide film on the side wall of the gate electrode. After a mask having an opening at a portion corresponding to the side wall area of the gate electrode is formed by a known technique, only the protective oxide film on the side wall is removed by means of etching. This mask may be so formed that the protective oxide film will be left on the control gate.

With use of this step, it is possible to remove the protective oxide film on the side wall of the gate electrode, which would cause a decrease in the overlapping area of the source region and the floating gate. Thus, the effective area of the tunnel insulating layer can be enlarged uniformly.

Figure 8:
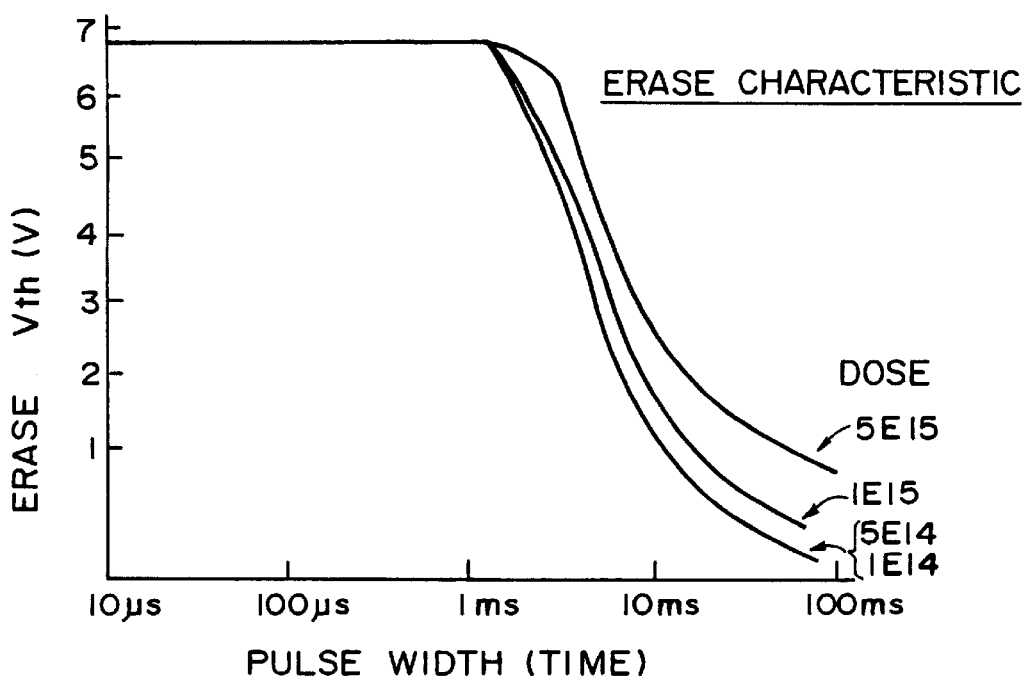
FIG. 8 illustrates a relationship between a dose of a impurity ion and an erase characteristic.
Figure 9:
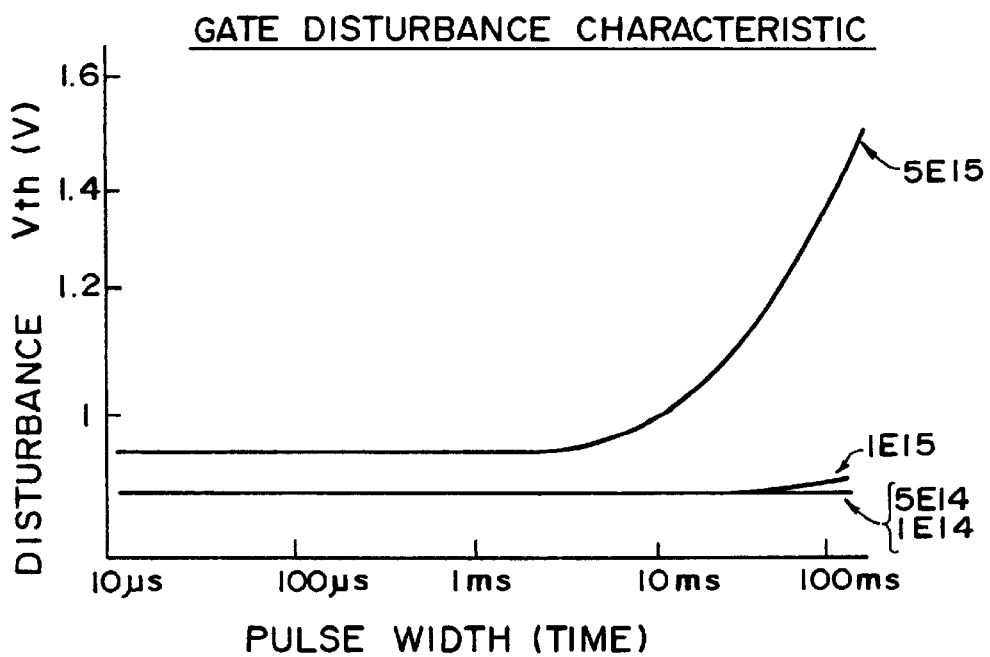
FIG. 9. Illustrates a relationship between the dose of the impurity ion and a gate disturbance characteristic.

Experimental Examples (a) FIGS. 8 and 9 show the results of an experiment carried out for investigating the relationship between a dose of impurity ions for providing conductivity to the floating gate and an erase characteristic and a relationship between a dose of impurity ions and a gate disturbance characteristic. In FIG. 8, the abscissa indicates the width of pulse applied to the source at the time of erasure, and the ordinate indicates the threshold of the gate electrode at the time of erasure. In FIG. 9, the abscissa indicates the width of pulse applied to the selected word line (gate) at the time of writing, and the ordinate indicates the threshold of the non-selected cell gate at the time of writing. Each flash-type EEPROM sample employed in this experiment comprises: the tunnel oxide film of each memory transistor having a thickness of 10 nm, the floating gate having a thickness of 130 nm, and different doses of phosphorus impurity being ion implanted at a voltage of 20 keV.

As can be seen from FIG. 8, a decrease in dose increases the speed of erasure, and as shown in FIG. 9, a decrease in dose reduces the tendency of gate disturbance.

The erase and gate disturbance characteristics contradict one another, i.e., as one is improved, the other worsens. However, as demonstrated in FIGS. 8 and 9, these erase and gate disturbance characteristics can be made compatible under the condition that a dose of ions implanted into the floating gate is in the range of $1 \times 10^{14}$ cm$^{-2}$ to $1 \times 10^{15}$ cm$^{-2}$. In particular, under the condition that the dose is in the range of $1 \times 10^{14}$ cm$^{-2}$ to $5 \times 10^{14}$ cm$^{-2}$, these characteristics can satisfactorily be made compatible.

Figure 10:
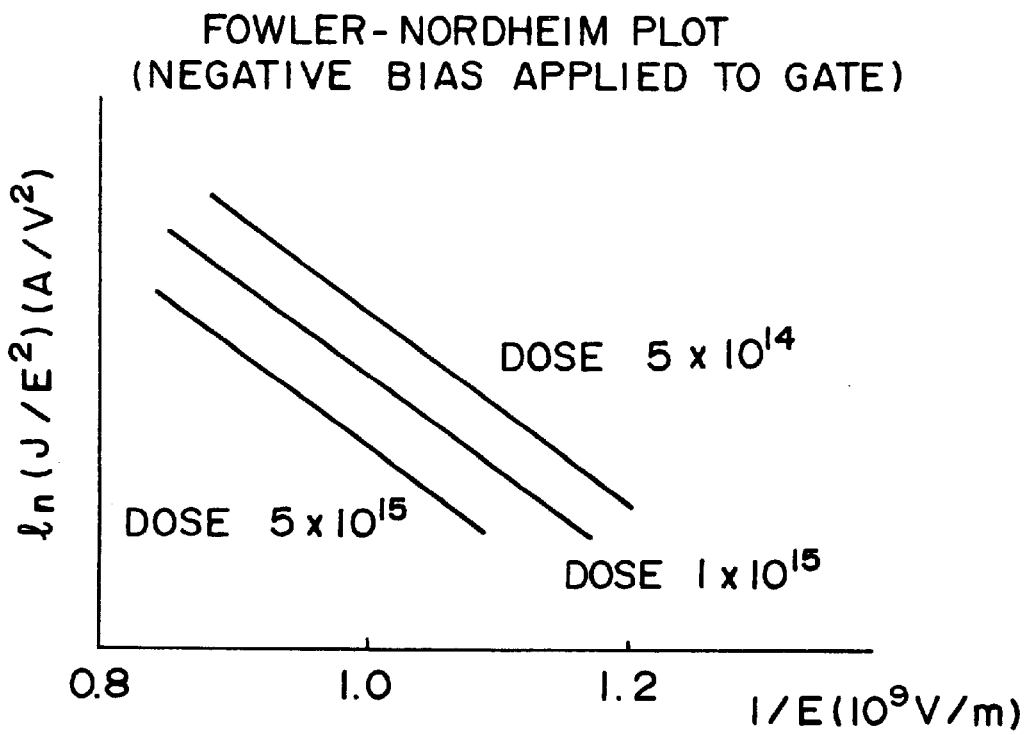
FIG. 10 illustrates a Fowler-Nordheim plot when an erase operation is performed.

(b) FIG. 10 shows a Fowler-Nordheim plot when a negative bias voltage is applied to the gate, i.e., an erase operation is performed. In FIG. 10, the abscissa indicates the reciprocal of electric field intensity, and the ordinate indicates a Fowler-Nordheim current. The sample used in this experiment is fabricated in the same manner as for the experiment (a).

In an erase operation, faster erasure is carried out as the Fowler-Nordheim current increases. In this respect, it is advantageous to increase the current. As can be seen from FIG. 10, as the dose of ions implanted in the floating gate decreases, the current increases to enhance performance in the erase characteristic.

Figure 11:
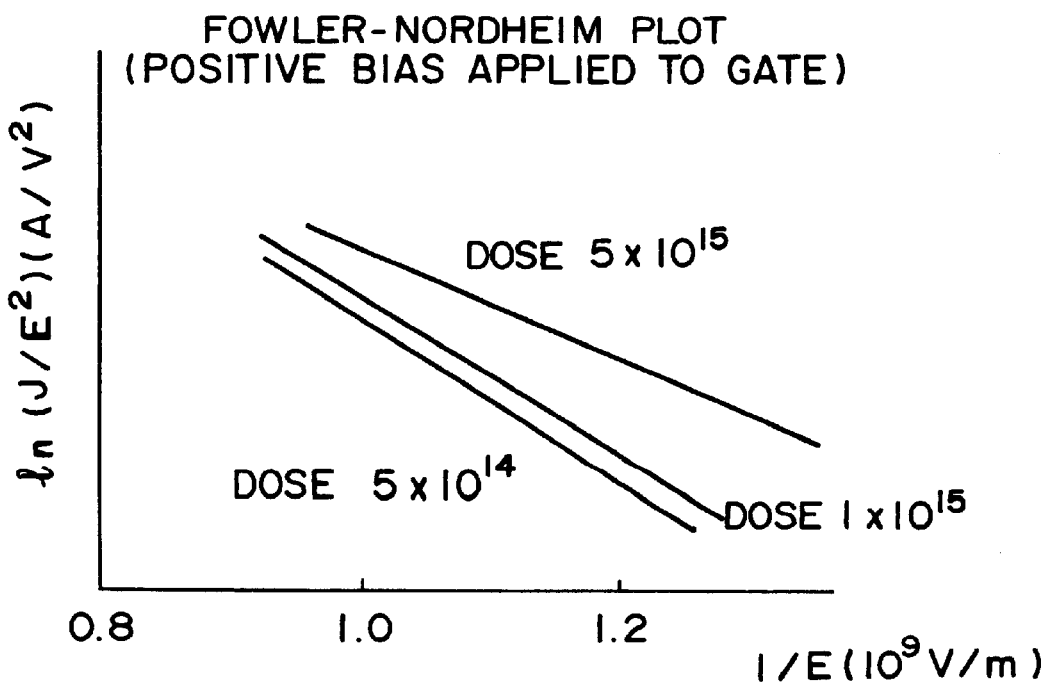
FIG. 11 illustrates a Fowler-Nordheim plot when a write operation is performed.

(c) FIG. 11 shows a Fowler-Nordheim plot when a positive bias voltage is applied to the gate, i.e., a write operation is performed. In FIG. 11, the abscissa indicates the reciprocal of electric field intensity, and the ordinate indicates a Fowler-Nordheim current. The sample used in this experiment is fabricated in the same manner as for the experiment (a).

In a write operation, it is advantageous to decrease the current for preventing occurrence of a gate disturbance. As can be seen from FIG. 11, as the dose of ions implanted in the floating gate decreases, the gate disturbance characteristic improves.

Figure 12:
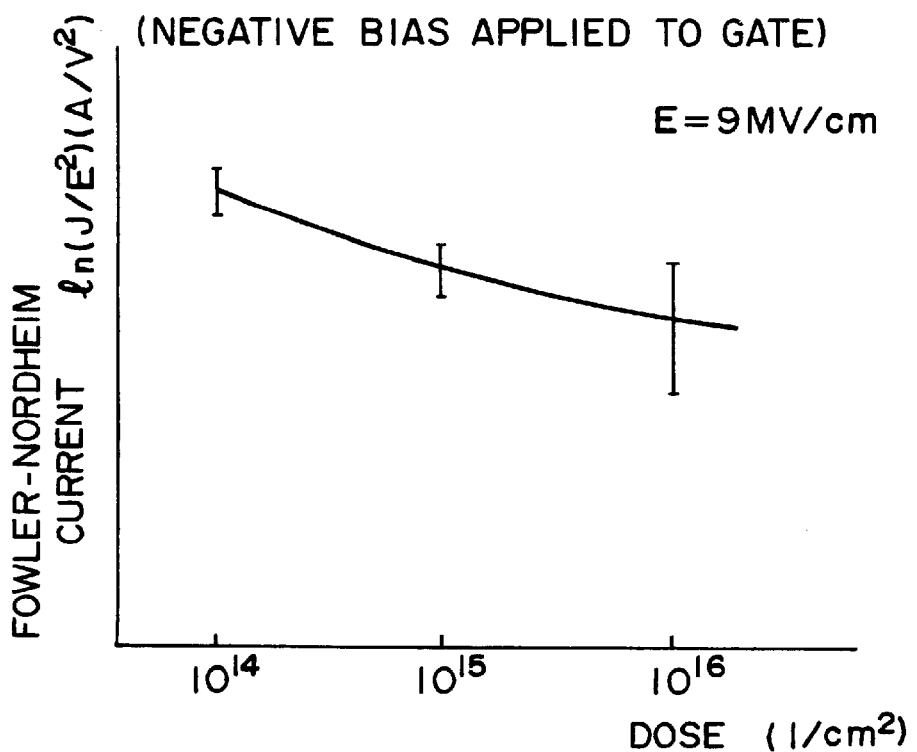
FIG. 12 illustrates a Fowler-Nordheim plot when an erase operation is performed.

(d) FIG. 12 shows a Fowler-Nordheim plot when a negative bias voltage is applied to the gate, i.e., an erase operation is performed. In FIG. 12, the abscissa indicates a dose of ions implanted in the floating gate, and the ordinate indicates a Fowler-Nordheim current.

A sample of the flash-type EEPROM memory transistor employed in this experiment comprises: the tunnel oxide film having a thickness of 10 nm, the floating gate having a thickness of 130 nm, and different doses of phosphorus impurity ions implanted at a voltage of 20 keV. The electric field intensity was 9 MV/cm.

As can be seen from FIG. 12, in an erase operation the Fowler-Nordheim current decreases as the dose increases. With an increase in the dose, the degree of variation increases in the Fowler-Nordheim current. Since the erase characteristic is required to be uniform, it is advantageous to minimize the degree of variation in the Fowler-Nordheim current. In this respect, the dose in the floating gate is preferably in the range of $1 \times 10^{14}$ cm$^{-2}$ to $1 \times 10^{15}$ cm$^{-2}$.

Figure 13:
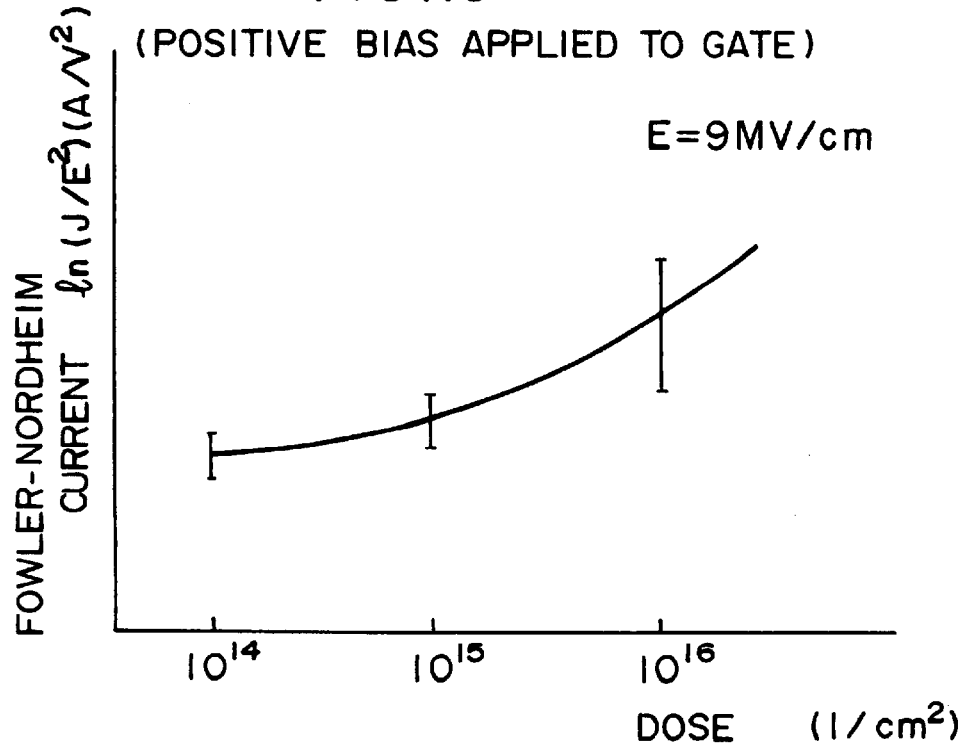
FIG. 13 illustrates a Fowler-Nordheim plot when a write operation is performed.

(e) FIG. 13 shows a Fowler-Nordheim plot when a positive bias voltage is applied to the gate, i.e., a write operation is performed. In FIG. 13, the abscissa indicates a dose in the floating gate, and the ordinate indicates a Fowler-Nordheim current. In this experiment, the sample employed is fabricated in the same manner as for the experiment (d).

As can be seen from FIG. 13, in a write operation, the Fowler-Nordheim current increases as the dose increases. With an increase of the dose, the degree of variation increases in the Fowler-Nordheim current. Since the write characteristic is required to be uniform, it is desirable to minimize the degree of variation in the Fowler-Nordheim current. In this respect, the dose in the floating gate is also preferably in the range of $1 \times 10^{14}$ cm$^{-2}$ to $1 \times 10^{15}$ cm$^{-2}$.

Figure 14:
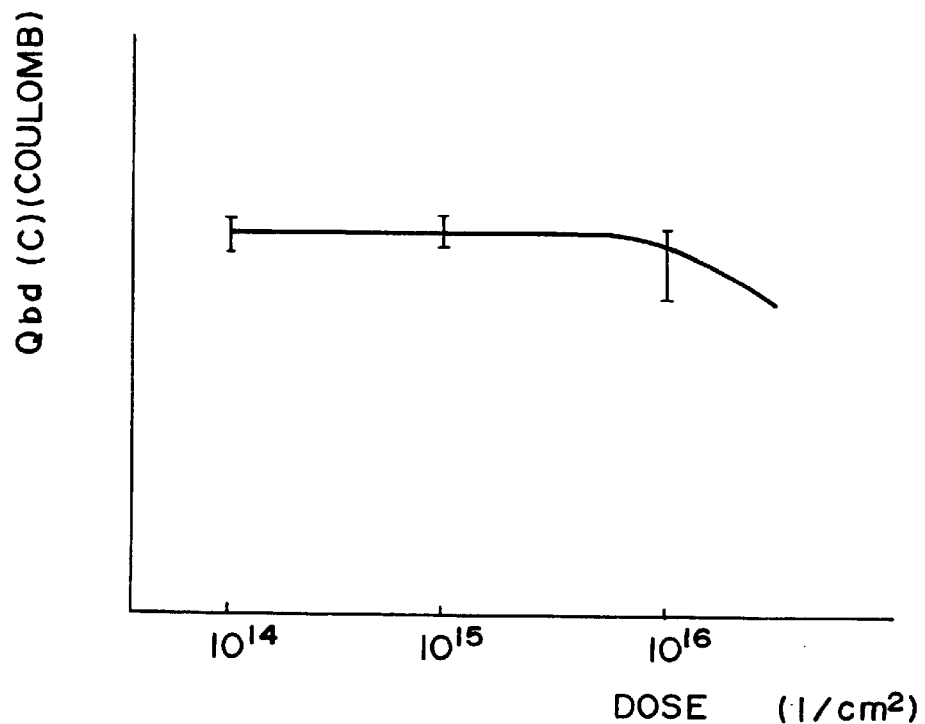
FIG. 14 illustrates a relationship between a dose in a floating gate and a quantity of passing charge allowable until occurrence of a breakdown of a tunnel oxide film.

(f) FIG. 14 shows the relationship between the dose in the floating gate and the lifetime of the tunnel oxide film, i.e., the quantity of passing charge $Q_{bd}$ allowable until occurrence of a breakdown of the tunnel oxide film. In this experiment, the sample employed is fabricated in the same manner as for the experiment (d).

According to the quantity of charge $Q_p$ (process-induced charge) passing through the tunnel oxide film in a manufacturing step performed after formation of the tunnel oxide film, the quantity of passing charge $Q_{bd}$ becomes lower than the quantity of intrinsic charge $Q_i$ determined by a factor such as an oxide film formation method. Therefore, a limitation is imposed on the allowable number of write/erase operations in the flash-type EEPROM which is affected by the quantity of passing charge $Q_{bd}$, and there is a possibility that the data retaining characteristic may deteriorate (occurrence of single-bit charge loss).

As shown in FIG. 14, the quantity of passing charge $Q_{bd}$ does not decrease under condition that a dose in the floating gate is in the range of $1\times10^{14}$ to $5\times10^{15}$ cm$^{-2}$. This means that the number of write/erase operations and the data retaining characteristic is maintained at satisfactory levels.

Figure 15:
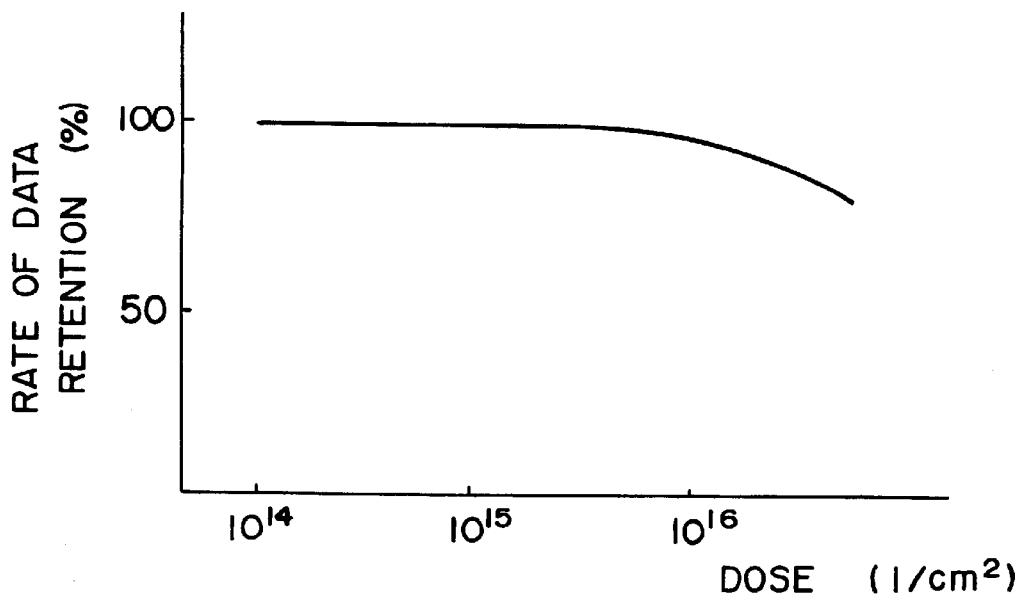
FIG. 15 illustrate a relationship between a data retaining characteristic of a memory cell and the dose in the floating gate.
Figure 16:
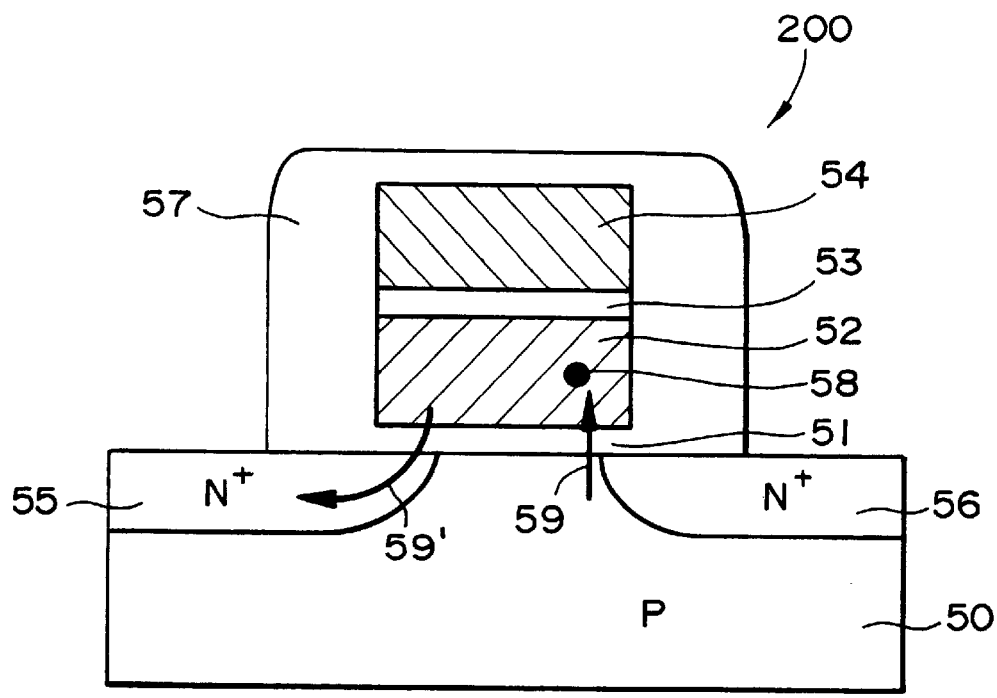
FIG. 16 is a schematic sectional view of a example of a common memory transistor in a flash-type EEPROM.

(g) FIG. 15 shows the relationship between the data retaining characteristic of the memory cell and the dose in the floating gate. In this experiment, the sample employed is a flash-type EEPROM of 1M bits which is fabricated in the same manner as for the experiment (d).

In the experiment, data was written into the sample, and then the rate of data retention was determined while maintaining the sample at a constant temperature of 250° C. in a thermostatic chamber.

As shown in FIG. 15, the data retaining characteristic does not decrease under the condition that a dose in the floating gate is in the range of $1\times10^{14}$ to $5\times10^{15}$ cm$^{-2}$.

While the present invention has been described in detail with respect to specific embodiments thereof, it is to be understood that the invention is not limited by any of the details of description and that various changes and modifications may be made without departing from the spirit and scope of the present invention.

What is claimed is:

1. A nonvolatile semiconductor memory device, comprising:
   a semiconductor substrate; and
   a memory transistor including a source region and a drain region which are impurity diffusion layers formed in said semiconductor substrate, a tunnel insulating layer formed on said semiconductor substrate, and a gate electrode of a stacked structure having a floating gate, a dielectric layer and a control gate which are layered on said tunnel insulating layer,
   wherein said floating gate is formed of a polysilicon layer having an impurity concentration of $1\times10^{19}$ to $1\times10^{20}$ cm$^{-3}$.

2. A nonvolatile semiconductor memory device according to claim 1, wherein said impurity concentration is in a range of $1\times10^{19}$ to $5\times10^{19}$ cm$^{-3}$.

3. A nonvolatile semiconductor memory device according to claim 1, wherein, denoting the impurity concentration of a polysilicon layer constituting said floating gate as $C_{FG}$ and the impurity concentration of a polysilicon layer constituting said control gate as $C_{CG}$, the following relational expression is satisfied:

$$0.3 \times C_{FG} \leq C_{CG} \leq 0.8 \times C_{FG}.$$

4. A nonvolatile semiconductor memory device according to claim 1, wherein said source region has an overlapping region with said floating gate, said overlapping region being 25 to 45% of a bottom surface of said floating gate.

5. A nonvolatile semiconductor memory device according to claim 1, wherein said source region comprises a first diffusion region having a high impurity concentration, and a second diffusion region disposed outside said first diffusion region and having an impurity concentration lower than that of said first diffusion region.

6. A method of manufacturing a nonvolatile semiconductor memory device, comprising steps of:
   (a) forming a tunnel insulating layer, a first polysilicon layer for a floating gate, a dielectric layer, and a second polysilicon layer for a control gate in a memory transistor formation region on a semiconductor substrate;
   (b) forming a gate electrode of a stacked structure including a floating gate, a dielectric layer, and a control gate by patterning said second polysilicon layer, said dielectric layer, and said first polysilicon layer; and
   (c) forming a source region and a drain region in said semiconductor substrate by doping with an impurity;
   wherein, in said step (a), said first polysilicon layer is doped with an impurity at a concentration of $1\times10^{19}$ to $1\times10^{20}$ cm$^{-3}$.

7. A method of manufacturing a nonvolatile semiconductor memory device according to claim 6, wherein a concentration of said impurity is in a range of $1\times10^{19}$ to $5\times10^{19}$ cm$^{-3}$.

8. A method of manufacturing a nonvolatile semiconductor memory device according to claim 6, wherein said first polysilicon layer is formed by doping a polysilicon layer with an impurity ion at a dose ranging from $1\times10^{14}$ to $1\times10^{15}$ cm$^{-2}$.

9. A method of manufacturing a nonvolatile semiconductor memory device according to claim 8, wherein said first polysilicon layer is formed by doping a polysilicon layer with an impurity ion at a dose ranging from $1\times10^{14}$ to $5\times10^{15}$ cm$^{-2}$.

10. A method of manufacturing a nonvolatile semiconductor memory device according to claim 6, wherein, denoting an impurity concentration of a polysilicon layer constituting said floating gate as $C_{FG}$ and an impurity concentration of a polysilicon layer constituting said control gate as $C_{CG}$, the following relational expression is satisfied:

$$0.3 \times C_{FG} \leq C_{CG} \leq 0.8 \times C_{FG}.$$

11. A method of manufacturing a nonvolatile semiconductor memory device according to claim 6, wherein said source region comprises a first diffusion region having a high impurity concentration, and a second diffusion region disposed outside said first diffusion region and having an impurity concentration lower than that of said first diffusion region.

12. A method of manufacturing a nonvolatile semiconductor memory device according to claim 6, further comprising a step (d), before said step (c), for forming a protective oxide layer to cover exposed surface of at least said tunnel insulating layer and gate electrode.

13. A method of manufacturing a nonvolatile semiconductor memory device according to claim 12, wherein, in said step (d), formation of said protective oxide layer on at least a side wall of said gate electrode is omitted.

* * * * *